(12) United States Patent
Ono et al.

(10) Patent No.: US 6,753,133 B2
(45) Date of Patent: Jun. 22, 2004

(54) METHOD AND MANUFACTURING A SEMICONDUCTOR DEVICE HAVING A RUTHENIUM OR A RUTHENIUM OXIDE

(75) Inventors: Yasuhiro Ono, Tokyo (JP); Sota Shinohara, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 145 days.

(21) Appl. No.: 10/091,531

(22) Filed: Mar. 7, 2002

(65) Prior Publication Data

US 2002/0132194 A1 Sep. 19, 2002

(30) Foreign Application Priority Data

Mar. 16, 2001 (JP) ........................................ 2001-076016

(51) Int. Cl.[7] ................................................ G03F 7/42
(52) U.S. Cl. ...................... 430/329; 430/313; 216/41; 134/1.1
(58) Field of Search ................................ 430/311, 313, 430/317, 318, 329; 216/41; 134/1, 1.1, 1.2, 1.3

(56) References Cited

U.S. PATENT DOCUMENTS

| | | | |
|---|---|---|---|
| 5,254,217 A | 10/1993 | Maniar et al. | 156/656 |
| 5,624,583 A | 4/1997 | Tokashiki et al. | 438/720 |
| 6,326,218 B1 | 12/2001 | Yunogami et al. | 438/3 |
| 6,399,399 B2 * | 6/2002 | Yamamoto | 438/3 |
| 6,607,988 B2 * | 8/2003 | Yunogami et al. | 438/720 |
| 2002/0070194 A1 * | 6/2002 | Nakahara et al. | 216/2 |

* cited by examiner

Primary Examiner—Kathleen Duda
(74) Attorney, Agent, or Firm—Sughrue Mion, PLLC

(57) ABSTRACT

A method for fabricating a semiconductor device includes the following steps. At first, a Ru or $RuO_2$ film and a $SiO_2$ layer are formed over a Si substrate in that order. Then, a resist pattern is formed on the $SiO_2$ layer and is then provided as a mask to etch the $SiO_2$ layer to form a contact hole. The Ru or $RuO_2$ film is exposed at the bottom of the contact hole. Subsequently, a plasma ashing is performed using an ashing gas prepared by mixing $O_2$ with $N_2$ where the composition ratio of $N_2$ is 50% or more at a substrate temperature of 200° C. or more for ashing the resist pattern. Consequently, the present invention allows the ashing of the resist pattern over the Ru or $RuO_2$ film at a high selectivity to prevent the Ru or $RuO_2$ film from becoming disappeared.

8 Claims, 5 Drawing Sheets

METHOD AND MANUFACTURING A SEMICONDUCTOR DEVICE HAVING A RUTHENIUM OR A RUTHENIUM OXIDE

BACKGROUND OF THE INVENTION

1. Field of the Invention

The present invention relates to a method for fabricating a semiconductor device and more particularly to a method for fabricating a semiconductor device, wherein an ashing of a resist film formed over a ruthenium film or a ruthenium oxide film can be performed at a high selectivity.

2. Description of the Prior Art

In recent years, semiconductor devices including ruthenium or ruthenium oxide have been actively studied and developed in the art. Among them, a capacitor having electrodes made of ruthenium or ruthenium oxide and a dielectric material such as $Pb(Zr_xTi_{1-x})O_3$, $(Ba_xSr_{1-x})TiO_3$, or $Ta_2O_5$ has been employed in some Ferroelectric Random Access Memory (FeRAM) or Dynamic Random Access Memory (DRAM).

Ruthenium and ruthenium oxide are capable of being processed into a high-anisotropic form by reactive ion etching using oxygen gas (e.g., U.S. Pat. No. 5,254,217 Maniar et al.) and a gas mixture of oxygen gas and halogen gas (e.g., U.S. Pat. No. 5,624,583 Tokashiki et al.). While it become possible to make the size of a capacitor electrode minimized with above etching method, there is a necessity to conduct an ashing of a photo-sensitive material (i.e., photoresist) formed over the electrode made of ruthenium or ruthenium oxide using oxygen plasma.

FIGS. 1a to 1e are cross sectional views for illustrating substantial steps in an exemplified conventional method for fabricating a semiconductor device having a ruthenium (Ru) film, wherein the step of ashing is performed after the step of contact hole etching.

First, as shown in FIG. 1a, a Ru film 12 and a silicon dioxide ($SiO_2$) layer 14 are formed over a silicon (Si) substrate 11. As shown in FIG. 1b, a photoresist is then applied on the $SiO_2$ layer 14 followed by a patterning step using photolithography process to form a resist pattern 13. As shown in FIG. 1c, subsequently, a contact hole 16 for connecting a wiring to the Ru film 12 is formed through the $SiO_2$ layer 14 by a dry etching process using $CF_4$ or the like. After that, as shown in FIG. 1d, the resist pattern 13 is subjected to a plasma ashing process using $O_2$ gas. During the ashing, the Ru film 12 is also gradually eroded because of the formation of volatile $RuO_3$ or $RuO_4$ as a result of reacting Ru with oxygen plasma 22. Consequently, the complete removal of the resist pattern 13 involves a substantial erosion of the Ru film 12. In some cases, the Ru film 12 under the contact hole 16 may be vanished as shown in FIG. 1e.

In the described conventional example, the ashing is performed after the contact hole etching. In the actual fabrication of the semiconductor device, there may be cases where such an ashing step in which the Ru film 12 may be exposed to oxygen plasma is performed more than one time. Thus, there is a possibility of vanish away the Ru film 12 from the structure after repeating the ashing step several times even though the entire Ru film 12 cannot be removed by the one ashing step.

For solving such a problem, Yunogami et al. (U.S. Pat. No. 6,326,218) disclose a method for preventing the Ru film 12 from erosion at the time of ashing the resist pattern 13 by forming a platinum (Pt) film 15 on a Ru film 12.

FIGS. 2a to 2e are cross sectional views for illustrating the steps in such a method disclosed in the above document. In this method, as shown in FIG. 2a, at first, the Ru film 12 is deposited over a Si substrate 11. Then, the platinum (Pt) film 15 is deposited on the Ru film 12. After patterning of the Pt film 15 and Ru film 12, a $SiO_2$ layer 14 is deposited on the Pt film 15. Then, as shown in FIG. 2b resist pattern 13 is formed on the $SiO_2$ layer 14. Furthermore, as shown in FIG. 2c, a contact hole 16 is formed through the $SiO_2$ layer 14 by a dry etching process using $CF_4$ or the like. After that, as shown in FIG. 2d, the resist pattern 13 is subjected to a plasma ashing process using oxygen plasma 22. In this case, as the Ru film 12 is covered with the Pt film 15, the Ru film 12 is not eroded at all, while the resist pattern 13 is completely incinerated by the ashing process as shown in FIG. 2e.

As described above, in the method for fabricating the conventional semiconductor device, the Ru film 12 may be eroded at the time of ashing. For preventing the Ru film 12 from the erosion, there is a necessity to deposit the Pt film 15 on the Ru film 12 to prevent it from erosion or disappearance. In this case, however, the fabrication becomes more complicated because of the additional steps of forming and patterning the Pt film 15 on the Ru film 12. In addition, the cost of fabricating the semiconductor device becomes increased because of costly Pt. Consequently, a sufficient productivity cannot be attained in the conventional method for fabricating a semiconductor device including Ru or Ru oxide. Furthermore, in some case, the formation of Pt film 15 on the Ru film 12 cannot be done as the need for directly forming a dielectric layer on the Ru film 12 comes out.

SUMMARY OF THE INVENTION

It is an object of the present invention to provide a method for fabricating a semiconductor device with a high productivity, wherein an ashing of a photo-sensitive material formed over ruthenium or ruthenium oxide can be easily realized at a high selectivity.

In a first aspect of the present invention, a method for fabricating a semiconductor device including at least one of a ruthenium and a ruthenium oxide comprises the step of ashing a photo-sensitive material over the ruthenium or the ruthenium oxide using a gas mixture containing oxygen gas or ozone gas and nitrogen gas, wherein the percentage composition of nitrogen gas is 50% or more.

Here, the ashing step may be performed by heating a substrate over which the ruthenium or the ruthenium oxide is formed at a temperature of 200° C. or more.

The ashing step may be performed after etching an interlayer insulation film on the ruthenium or the ruthenium oxide using a photo-sensitive material as a mask. Alternatively, the ashing step may be performed after etching of the ruthenium or the ruthenium oxide using a photo-sensitive material as a mask.

In a second aspect of the present invention, a method for fabricating a semiconductor device including at least one of a ruthenium and a ruthenium oxide, comprising the steps of: forming a film made of the ruthenium or the ruthenium oxide over a substrate; forming an interlayer insulation film on the ruthenium or the ruthenium oxide film; applying a photo-sensitive material on the interlayer insulation film and patterning the applied photo-sensitive material; etching the interlayer insulation film using the patterned photo-sensitive material as a mask; and ashing the patterned photo-sensitive material using an ashing gas provided as a mixture of a gas that contains oxygen gas or ozone gas and a gas that contains nitrogen gas, wherein the percentage composition of nitrogen gas is 50% or more.

Here, a contact hole for exposing the ruthenium film or the ruthenium oxide film may be formed in the step of etching the interlayer insulation film.

According to the above first or second aspect of the invention, there is an advantage of effectively performing the ashing of the photo-sensitive material with a high selectivity and a high ashing rate while preventing a partial disappearance of the ruthenium film or the ruthenium oxide film.

The reason for such an advantage is as follows. In the prior art method, the ruthenium is etched by oxygen plasma because ruthenium is oxidized to form a volatile compound, i.e., $RuO_3$ or $RuO_4$. In this case ruthenium may be eroded or disappeared at the time of performing ashing of the photoresist using oxygen plasma.

On the other hand, according to the present invention the gas for ashing is prepared by mixing $O_2$ gas with a large amount of $N_2$ gas, so that the probability of a collision of oxygen with ruthenium can be decreased. At this time, the ashing rate of photoresist may be slightly decreased with a degree less than the decrease of etching rate of ruthenium. Therefore, the ashing of photoresist with an improved selectivity with respect to ruthenium can be attained.

BRIEF DESCRIPTION OF THE DRAWINGS

The above and other objects, advantages and features of the present invention will be more apparent from accompanying drawings, in which.

DETAILED DESCRIPTION OF THE PREFERRED EMBODIMENT

The invention will be now described herein with reference to illustrative embodiment. Those skilled in the art will recognize that many alternative embodiments can be accomplished using the teachings of the present invention and that the invention is not limited to the embodiment illustrated for explanatory purposes.

Referring now to FIGS. 3a to 3e, a method for fabricating a semiconductor device will be described as one of preferred embodiments of the present invention.

Figure 1A:
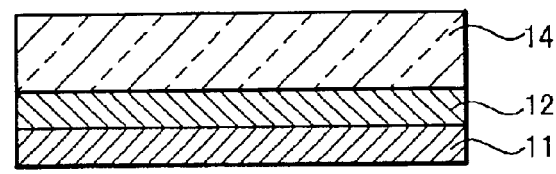
FIGS. 1a to 1e are cross sectional views for illustrating respective steps in the method for fabricating a semiconductor device including a Ru film as a first conventional example in which an ashing of a photoresist is performed after contact hole etching.
Figure 1B:
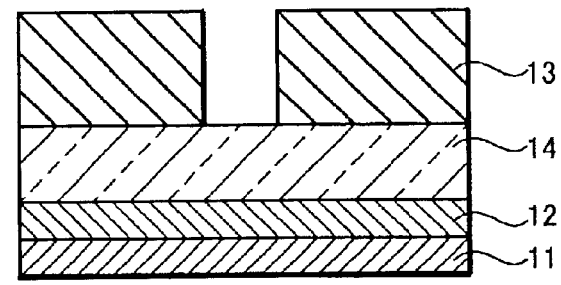
Figure 1C:
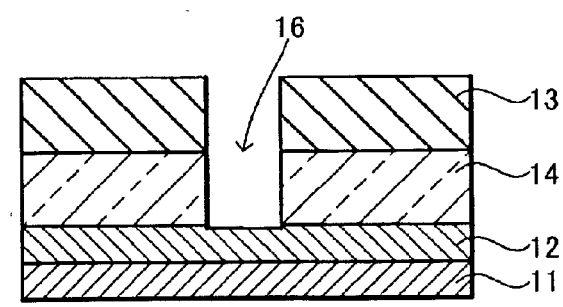
Figure 1D:
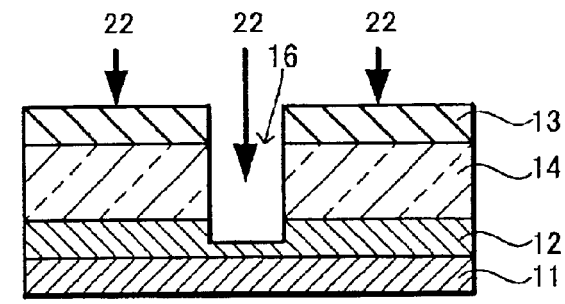
Figure 1E:
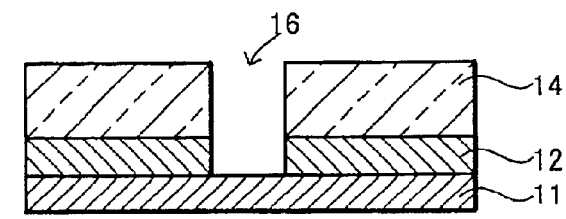
Figure 2A:
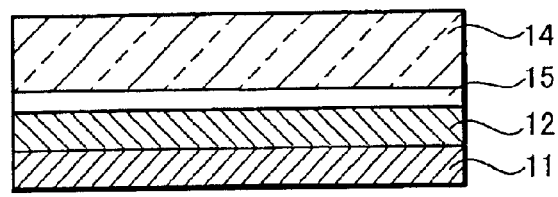
FIGS. 2a to 2e are cross sectional views for illustrating respective steps in the method for fabricating a semiconductor device including a Ru film as a second conventional example in which an ashing of a photoresist is performed after contact hole etching.
Figure 2B:
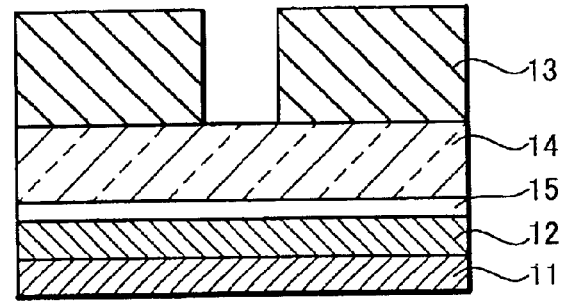
Figure 2C:
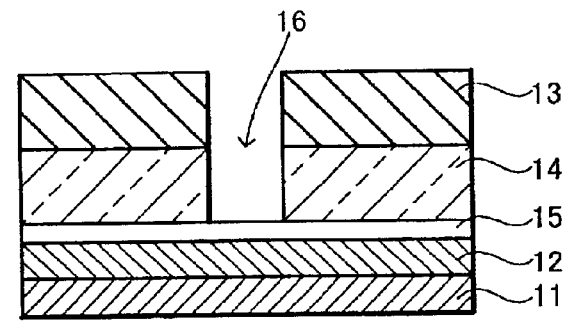
Figure 2D:
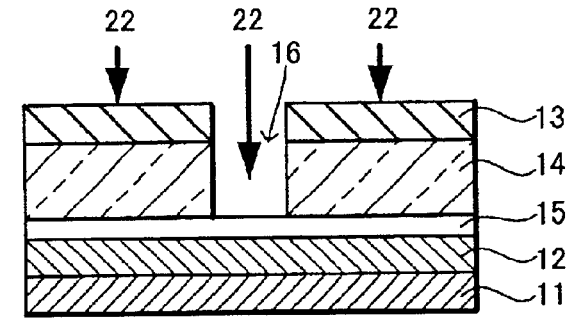
Figure 2E:
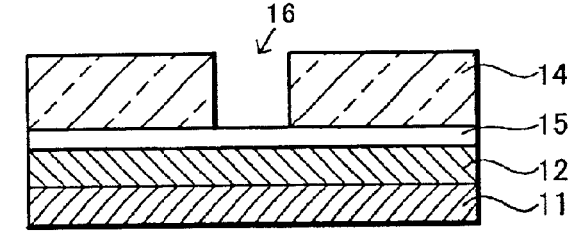
Figure 3A:
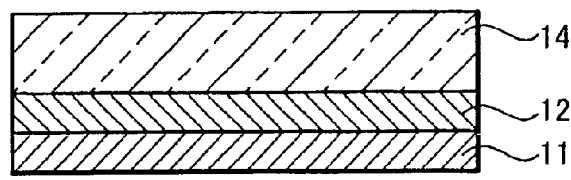
FIGS. 3a to 3e are cross sectional views for illustrating respective steps in the method for fabricating a semiconductor device including a Ru film as one of preferred embodiments of the present invention in which an ashing of a photoresist is performed after contact hole etching.
Figure 3B:
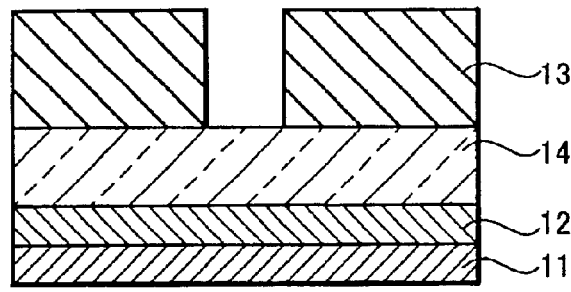
Figure 3C:
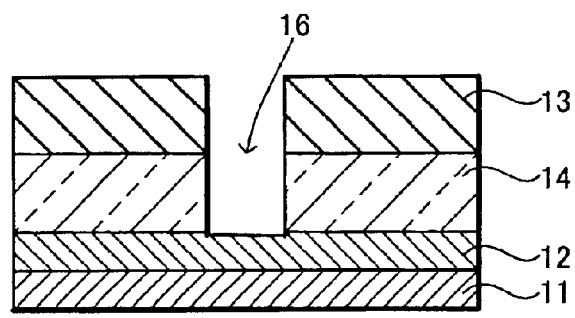

As shown in FIG. 3a, at first, a Ru film 12 with a thickness of 100 nm is formed over a silicon (Si) substrate 11 and a silicon dioxide ($SiO_2$) layer (i.e., an interlayer insulation film) 14 with a thickness of 500 nm is deposited on the Ru film 12. Next, as shown in FIG. 3b, a photo-sensitive material (i.e., photoresist) is applied on the $SiO_2$ layer 14, followed by a patterning step using a photolithography process to obtain a resist pattern 13 with a thickness of 1000 nm. Subsequently, as shown in FIG. 3C, the resist pattern 13 is used as a mask for etching the $SiO_2$ layer 14 by a dry etching process using $CF_4$ or the like to form a contact hole 16 extending through the $SiO_2$ film 14. As shown in the figure, a part of the surface of the Ru film 12 is exposed at the bottom of the contact hole 16, so that the Ru film 12 can be used as an electrode or the like. An etching selectivity of $SiO_2$ with respect to Ru is 20 or more. Thus, for example, the Ru film 12 can be etched about 25 nm in a thickness direction if the amount of over etching is set to 100%. In this case, therefore, the thickness of the remaining Ru film 12 is about 75 nm.

Figure 3D:
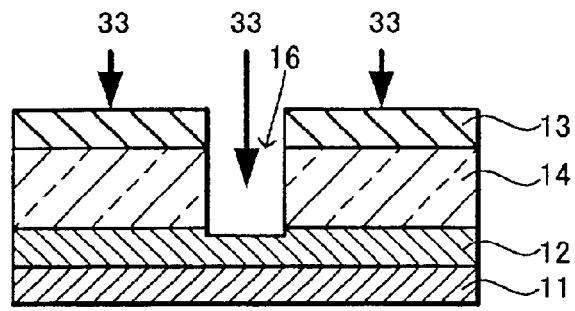
Figure 3E:
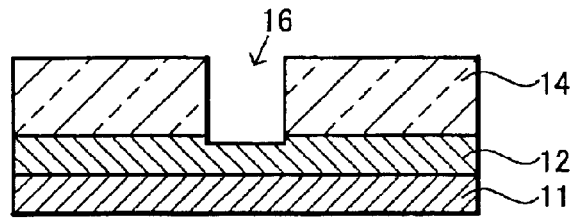

Furthermore, as shown in FIG. 3d, the resist pattern 13 is removed by ashing using oxygen/nitrogen plasma 33. In this embodiment, the ashing step is performed by an application of 1000 W of 13.56 MHz RF power at a substrate temperature of 250° C. with 360 mTorr of pressure. An ashing gas used in the present embodiment is a mixture gas consisting 220 sccm of $O_2$ and 220 sccm of $N_2$. In other words, the composition ratio of $N_2$ (i.e., $N_2/(N_2+O_2)$ by volume) is 50%.

Figure 4:
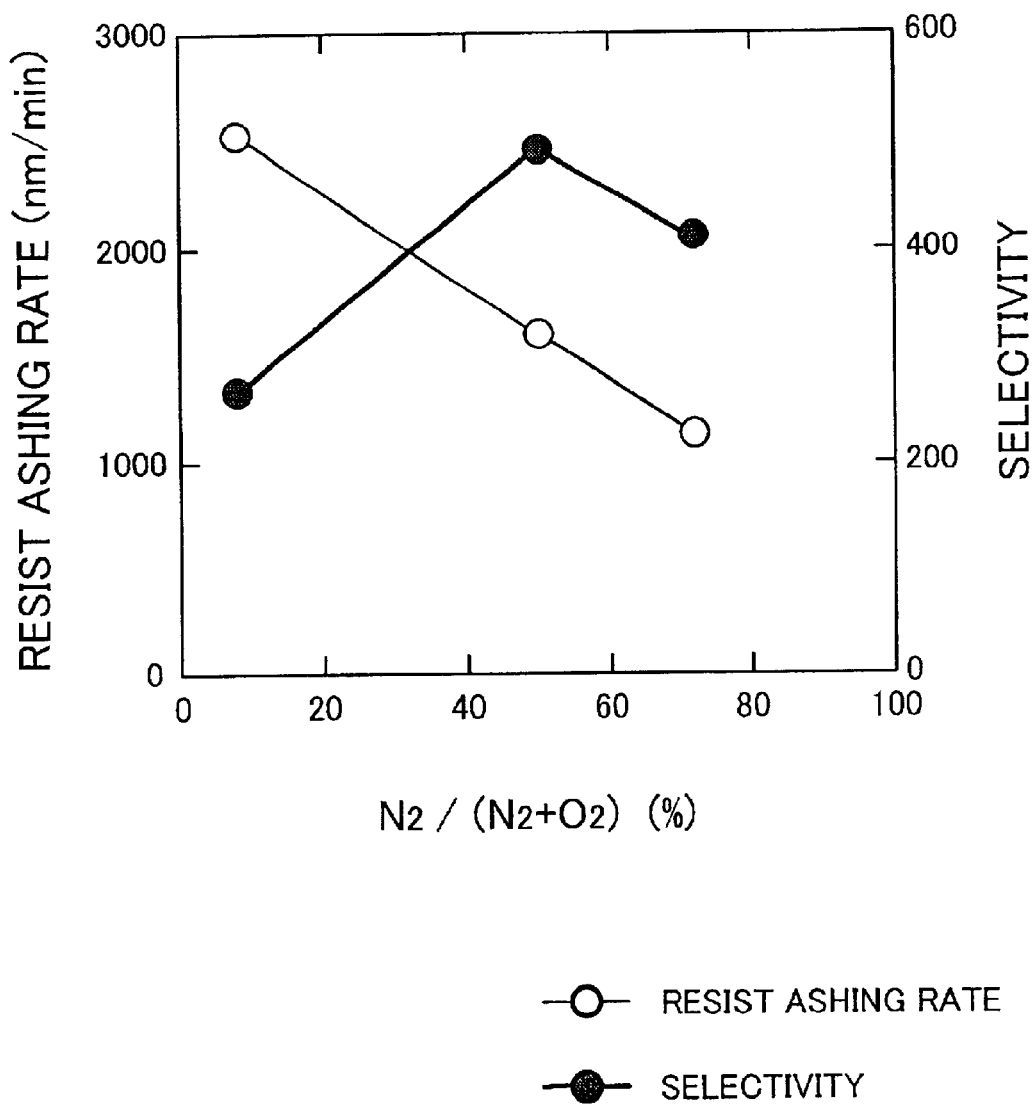
FIG. 4 is a graph for illustrating the characteristic features of selectivity and ashing rate with respect to the composition of gas prepared by mixing $O_2$ gas with $N_2$ gas.

In the present invention, the conditions of the ashing step, especially the composition of the ashing gas and the substrate temperature are studied. FIG. 4 shows the results of the experiments for estimating the characteristic features of selectivity (i.e., etching rate of resist/etching rate of Ru) and resist ashing rate with respect to the composition ratio of $N_2$ in the ashing gas prepared by mixing $O_2$ with $N_2$ in a capacitively coupled plasma ashing apparatus with an application of 1000 W of 13.56 MHz RF power under the conditions of a total gas flow of 440 sccm, a substrate temperature of 250° C., and a pressure of 360 mTorr. As is evident from FIG. 4, the selectivity becomes the maximum when the composition ratio of $N_2$ is 50%, and the selectivity when the composition ratio of $N_2$ is 50% is at least twice as large as the selectivity when the composition ratio of $N_2$ is 10%. As is evident from FIG. 4, the ashing rate of the resist decreases as the composition ratio of $N_2$ increases. The ashing rate of the resist when the composition ratio of $N_2$ is 50% is about 0.7-fold of one when the composition ratio of $N_2$ is 10%. However, a substantial impairment of the productivity cannot be observed because of a resist ashing rate of 1600 nm/min or more.

Furthermore, additional experiments for estimating the characteristic features of selectivity and ashing rate with respect to the substrate temperature are performed on samples having such a film structure under the following ashing conditions. That is, the ashing is performed using an ashing gas provided as a mixture of 400 sccm $O_2$ gas and 40 sccm $N_2$ (composition ratio of $N_2$ is about 9%) with an application of 1000 W of 13.56 MHz RF power under the conditions of a pressure of 360 mTorr and a substrate temperature of 150, 200, or 250° C. The obtained results are shown in FIG. 5.

Figure 5:
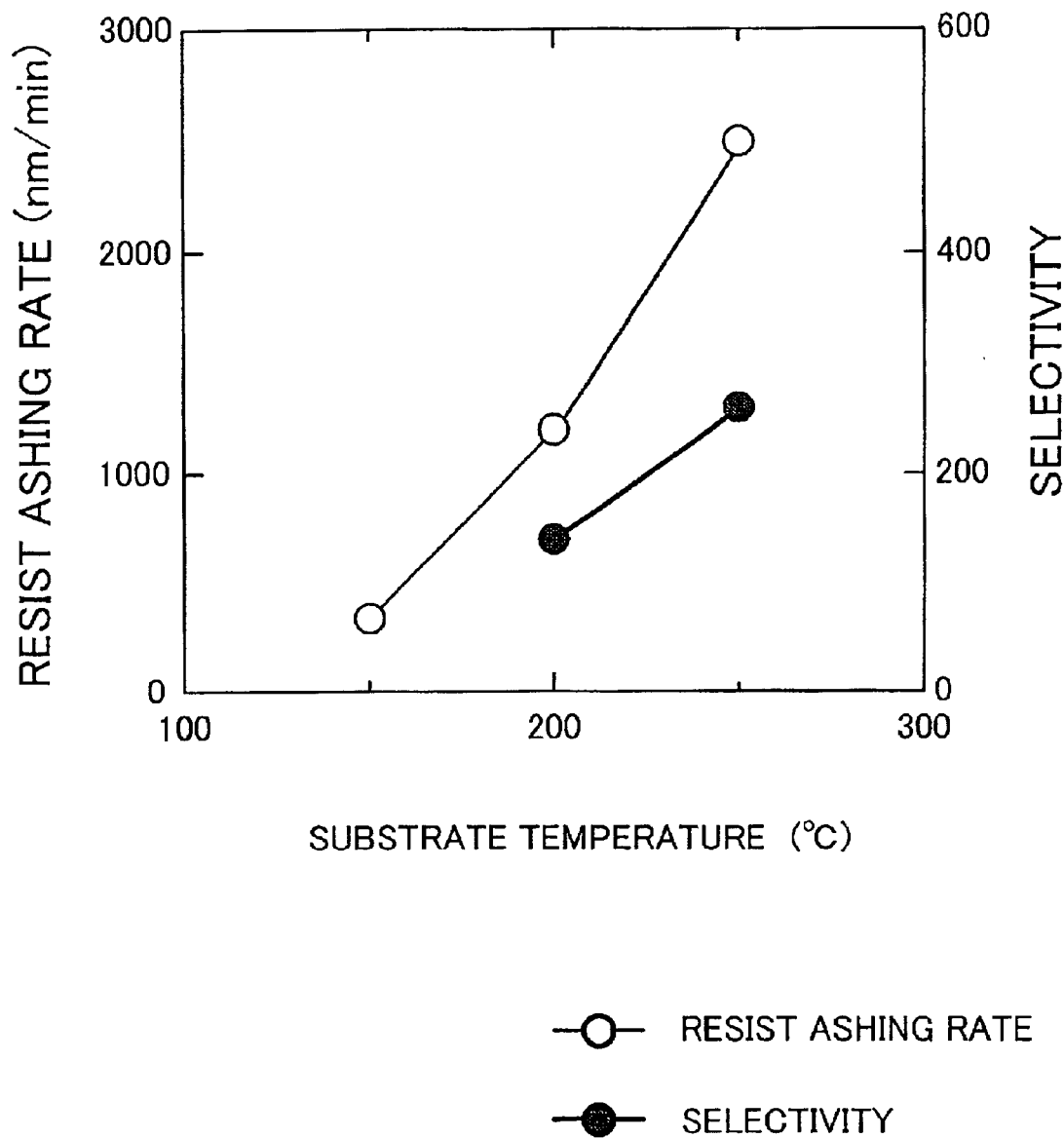
FIG. 5 is a graph for illustrating the characteristic features of selectivity and ashing rate with respect to substrate temperature in the ashing step.

As is evident from FIG. 5, each of the selectivity and the ashing rate rapidly decreases as the substrate temperature decreases. When the substrate temperature is 200° C., the selectivity and the resist ashing rate become almost half of those at a temperature of 250° C. If the substrate temperature further decreases, then the ashing rate further decreases, resulting in no practical applicability.

In this embodiment, from the above results, the ashing conditions are concluded as described above in which the ashing is performed using an ashing gas provided as a mixture of 220 sccm $O_2$ gas and 220 sccm $N_2$ (composition ratio of $N_2$ is about 50%) with an application of 1000 W of 13.56 MHz RF power under at a pressure of 360 mTorr and a substrate temperature of 250° C. Under such conditions, the selectivity of resist/Ru is about 500. Therefore, the erosion of Ru is only of 20 nm in thickness even if the ashing time is a ten-fold of the time period required for removing the resist of 1000 nm in thickness. The thickness of Ru film before the ashing is 75 nm, so the Ru electrode 12 can be remained without disappearance even if the ashing step is repeatedly performed three times.

By way of experiment, if the composition ratio of $N_2$ is 10%, the Ru film 12 can be perfectly disappeared by repeating a similar step only two times.

Considering with the results or the like shown in FIGS. 4 and 5, as described above, the selectivity can be increased by increasing the composition ratio of $N_2$ to 50% or more. In this case, we can find that the Ru film 12 is hardly disappeared even though the ashing step is repeated several times. As shown in FIGS. 4 and 5, furthermore, it is preferable that the substrate temperature may be 200° C. or more in the ashing step so as to prevent the selectivity and the ashing rate from becoming too low.

As described above, the present invention allows the ashing of the photo-sensitive material over the Ru film at a high selectivity, so that the semiconductor device can be fabricated at a low cost. In addition, at the time of ashing the photo-sensitive material, the Ru film can be prevented from becoming partially disappeared.

Although the present invention has been described in connection with the preferred embodiment thereof with reference to the accompanying drawings, various changes and modifications are apparent to those skilled in the art.

In the embodiment, the Ru film 12 is formed over the Si substrate 11. However, it is not limited to such a structure. Similar effects can be obtained by forming a ruthenium oxide film such as $RuO_2$ film over the Si substrate 11. Obviously, same effects can be obtained with a laminated structure of ruthenium film and ruthenium oxide film, too.

Furthermore, instead of the gas prepared by mixing the $O_2$-containing gas with the $N_2$-containing gas, a gas prepared by mixing $O_3$-containing gas with $N_2$-containing gas may be used for obtaining similar effects. Thus, the mixture gas may be one prepared by mixing at least one of $O_2$ and $O_3$ with $N_2$.

In the embodiment, the ashing after the contact hole etching of the interlayer insulation film ($SiO_2$ film) on the Ru film is described. It may be also applied on the whole steps in which the Ru film is exposed at the time of ashing, for example the ashing step after patterning the Ru film using a resist pattern as a mask.

It is to be noted that various other changes and modifications are apparent to those skilled in the art. Such changes and modifications are to be understood as included within the scope of the present invention as defined by the appended claims, unless they depart therefrom.

What is claimed is:

1. A method for fabricating a semiconductor device including at least one of a ruthenium and a ruthenium oxide, comprising:

ashing a photo-sensitive material over the ruthenium or the ruthenium oxide using a gas mixture containing oxygen gas or ozone gas and nitrogen gas, wherein the percentage composition of nitrogen gas is 50% or more.

2. The method as claimed in claim 1, wherein the ashing is performed by heating a substrate over which the ruthenium or the ruthenium oxide is formed at a temperature of 200° C. or more.

3. The method as claimed in claim 1, wherein the ashing is performed after etching an interlayer insulation film on the ruthenium or the ruthenium oxide using the photo-sensitive material as a mask.

4. The method as claimed in claim 1, wherein the ashing may be performed after patterning the ruthenium or ruthenium oxide using the photo-sensitive material as a mask.

5. A method for fabricating a semiconductor device including at least one of a ruthenium and a ruthenium oxide, comprising the steps of:

forming a film made of ruthenium or ruthenium oxide over a substrate;

forming an interlayer insulation film on the ruthenium or the ruthenium oxide film;

applying a photo-sensitive material on the interlayer insulation film and patterning the applied photo-sensitive material;

etching the interlayer insulation film using the patterned photo-sensitive material as a mask; and ashing the patterned photo-sensitive material using an ashing gas provided as a mixture of a gas that contains oxygen gas or ozone gas and a gas that contains nitrogen gas, wherein the percentage composition of nitrogen gas is 50% or more.

6. The method as claimed in claim 5, wherein the ashing is performed by heating the substrate at a temperature of 200° C. or more.

7. The method as claimed in claim 5, wherein a contact hole for exposing the ruthenium film or the ruthenium oxide film is formed in the step of etching the interlayer insulation film.

8. The method as claimed in claim 5, wherein the interlayer insulation film is made of silicon dioxide.

* * * * *